United States Patent
Chen et al.

(10) Patent No.: US 7,425,855 B2
(45) Date of Patent: Sep. 16, 2008

(54) SET/RESET LATCH WITH MINIMUM SINGLE EVENT UPSET

(75) Inventors: David Jia Chen, Endwell, NY (US); Eugene James Nosowicz, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 11/181,707

(22) Filed: Jul. 14, 2005

(65) Prior Publication Data

US 2007/0013426 A1    Jan. 18, 2007

(51) Int. Cl.
*H03K 2/289* (2006.01)

(52) U.S. Cl. .................. 327/202; 327/203; 327/208; 327/209; 327/217; 327/218; 714/726

(58) Field of Classification Search ............. None
See application file for complete search history.

(56) References Cited

U.S. PATENT DOCUMENTS

| | | | | |
|---|---|---|---|---|
| 5,001,361 | A * | 3/1991 | Tamamura et al. | 327/202 |
| 6,008,678 | A * | 12/1999 | Barber | 327/203 |
| 6,373,771 | B1 * | 4/2002 | Fifield et al. | 365/225.7 |
| 6,433,586 | B2 * | 8/2002 | Ooishi | 326/93 |
| 6,624,677 | B1 * | 9/2003 | Wissel | 327/202 |
| 6,803,799 | B1 * | 10/2004 | Churchill et al. | 327/202 |

* cited by examiner

*Primary Examiner*—Tuan T. Lam
*Assistant Examiner*—Hiep Nguyen
(74) *Attorney, Agent, or Firm*—Joan Pennington

(57) ABSTRACT

A method and latch circuits are provided for implementing enhanced noise immunity performance. Each latch circuit includes any L1 latch and an L2 latch coupled to the L1 latch. Data is first latched in the L1 latch during a first half clock cycle and then latched in the L2 latch during a second half clock cycle. A path opposite a latched data state is gated off in both the L1 latch and the L2 latch, where a path to a voltage supply rail is gated off with a latched low data state and a path to ground is gated off with a latched high data state.

2 Claims, 4 Drawing Sheets

SET/RESET LATCH WITH MINIMUM SINGLE EVENT UPSET

FIELD OF THE INVENTION

The present invention relates generally to the data processing field, and more particularly, relates to a method and latch circuits having set/reset capability for implementing enhanced noise immunity performance.

DESCRIPTION OF THE RELATED ART

A need exists for a latch, such as a shift register latch or level sensitive scan design (LSSD) L1L2 latch, with set/reset capability and able to maintain its latched states regardless of glitches on any one of its internal nodes. Such glitches can be caused by noise internal to the chip or free charge produced by impacts from incident radiation.

The current solution implemented in a conventional shift register latch or LSSD L1L2 latch pair to avoid single event upsets is to add devices arranged as capacitors to specific internal nodes in order to resist voltage glitches caused by noise or the like. This approach is becoming increasingly more difficult to implement with each new technology iteration as the device sizes shrink and the amount of capacitance added with each device is smaller and the area required to add enough capacitance is becoming prohibitive.

Another latch arrangement has been proposed that would not allow the latch to flip state as a result of a glitch on an internal node. The latch includes gating devices to gate paths to an incorrect state with at least one gating device having a terminal that is tied to the output of the latch. The output of the latch can have a long wire connected to other logic that makes the latch output susceptible to noise. The noise on the wire can diminish the protection of the gating device and the latch also does not have set or reset capability.

SUMMARY OF THE INVENTION

Principal aspects of the present invention are to provide a method and latch circuits having set/reset capability for implementing enhanced noise immunity performance. Other important aspects of the present invention are to provide such method and latch circuits having set/reset capability for implementing enhanced noise immunity performance substantially without negative effect and that overcome many of the disadvantages of prior art arrangements.

In brief, a method and latch circuits are provided for implementing enhanced noise immunity performance. Each latch circuit includes an L1 latch and an L2 latch coupled to the L1 latch. Data is first latched in the L1 latch during a first half clock cycle and then latched in the L2 latch during a second half clock cycle. A plurality of gated transistors in both the L1 latch and the L2 latch gate off a path opposite a latched data state.

In accordance with features of the invention, in the L1 latch and the L2 latch, when a node is latched to a low data state, a path from the node to a voltage supply rail is gated off. In the L1 latch and the L2 latch, when a node is latched to a high data state, a path from the node to ground is gated off.

In accordance with features of the invention, the L2 latched data states are used to gate off paths in the L1 latch. The L1 latched data states are used to gate off paths in the L2 latch. An internal node L1_T of the L1 latch and a first internal node L2_T of the L2 latch have the same state as the input data. An output node L1_TP of the L1 latch and a second internal node L2_N of the L2 latch has an inverse state as the input data.

In accordance with features of the invention, in the L1 latch, a stack of series connected transistors between the internal node L1_T and the voltage supply includes a PFET connected to voltage supply having a gate input coupled to the second internal node L2_N of the L2 latch. In the L1 latch, a stack of series connected transistors between the internal node L1_T and ground includes an NFET connected to ground having a gate input coupled to the second internal node L2_N of the L2 latch. In the L1 latch, a stack of series connected transistors between the output node L1_TP and the voltage supply includes a PFET connected to voltage supply having a gate input coupled to the second internal node L2_T of the L2 latch. In the L1 latch, a stack of series connected transistors between the output node L1_TP and ground includes an NFET connected to ground having a gate input coupled to the second internal node L2_T of the L2 latch.

In accordance with features of the invention, in the L2 latch, a stack of series connected transistors between the internal node L2_T and the voltage supply includes a PFET connected to voltage supply having a gate input coupled to the output node L1_TP of the L1 latch. In the L2 latch, a stack of series connected transistors between the internal node L2_T and ground includes an NFET connected to ground having a gate input coupled to the output node L1_TP of the L1 latch. In the L2 latch, both a stack of series connected transistors between the internal node L2_N and the voltage supply and a stack of series connected transistors between the output node L2 and the voltage supply includes a PFET connected to voltage supply having a gate input coupled to the output node L1_TP of the L1 latch. In the L2 latch, a stack of series connected transistors between the internal node L2_N and ground and a stack of series connected transistors between the output node L2 and ground includes an NFET connected to ground, each having a gate input coupled to the output node L1_TP of the L1 latch.

In accordance with features of the invention, the latch circuits have set/reset capability.

In accordance with features of the invention, the L1 latch includes an NFET connected between an output node L1_TP and ground and receiving a gate set input that pulls the output node L1_TP low when the set input SET goes high. The L1 latch includes a PFET coupled between an output node L1_TP and a voltage supply and receiving a gate set input. The high signal on the set input also turns off PFET to gate off a path from the output node L1_TP to the voltage supply where clock C is high and D is low.

In accordance with features of the invention, the L1 latch includes an NFET coupled between an output node L1_TP and ground and receiving a gate reset input that turns off the NFET to gate off a path from the output node L1_TP to ground where clock C is high and D is high. The L1 latch includes a PFET coupled between an output node L1_TP and a voltage supply and receiving a gate reset and the output node L1_TP is pulled high by the PFET with the low signal on the reset input.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
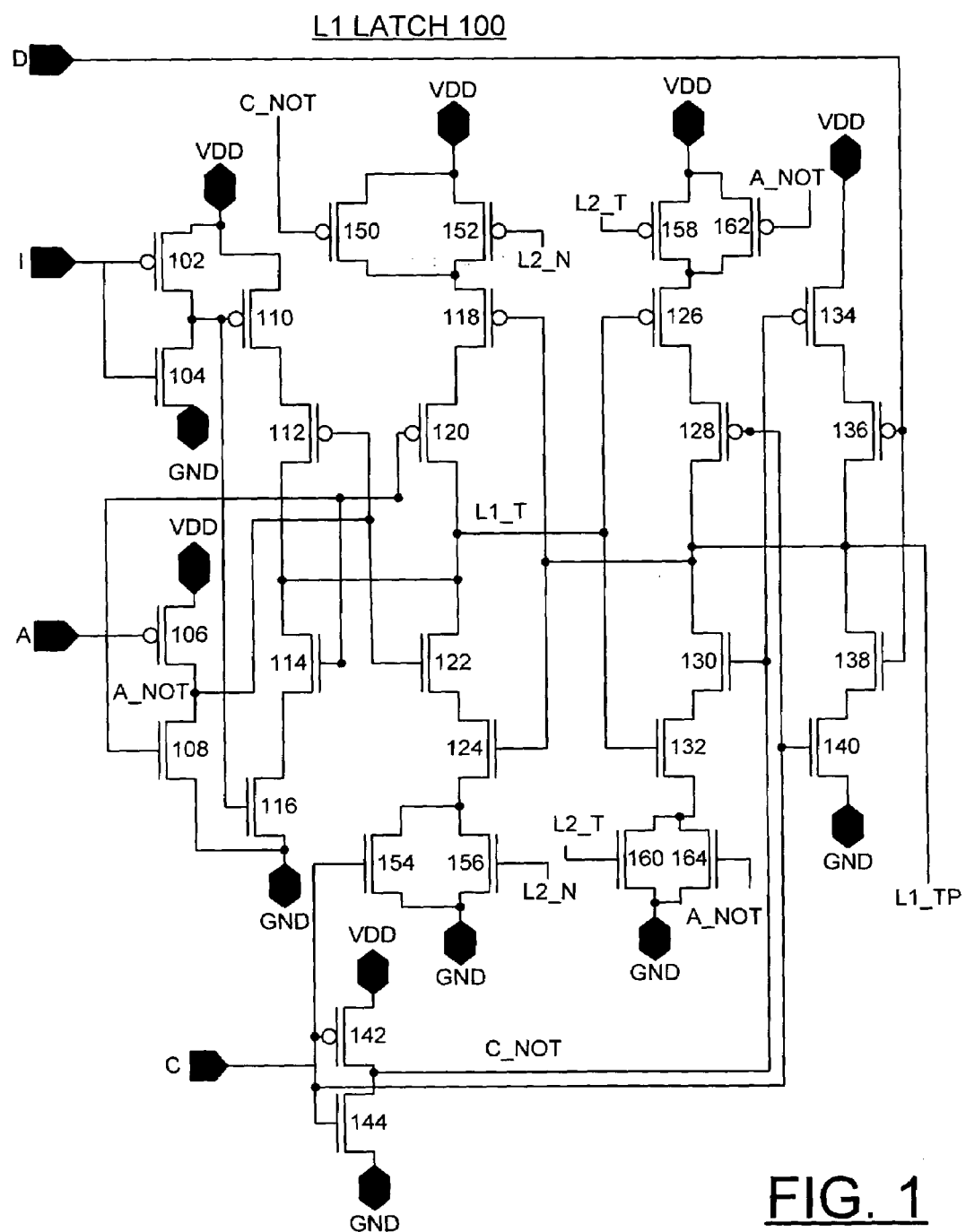
FIG. 1 is a schematic diagram of an exemplary L1 latch of an exemplary level sensitive scan design (LSSD) L1L2 latch implemented in accordance with a method of the preferred embodiment.
Figure 2:
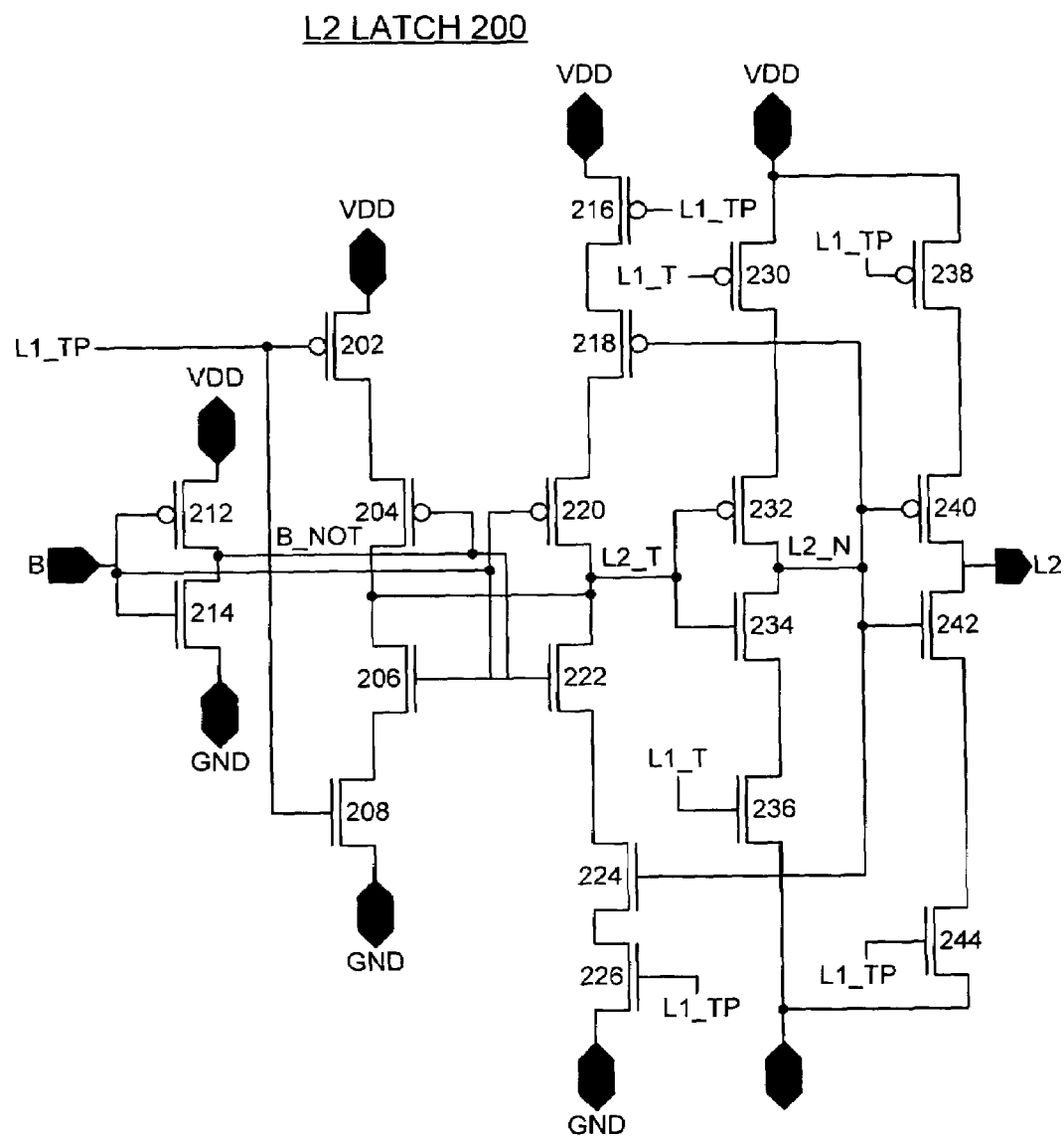
FIG. 2 is a schematic diagram of an exemplary L2 latch of an exemplary level sensitive scan design (LSSD) L1L2 latch implemented in accordance with a method of the preferred embodiment.

Having reference now to the drawings, in FIGS. 1 and 2, there are shown an exemplary L1 latch generally designated by the reference character 100 of an exemplary level sensitive scan design (LSSD) L1L2 latch implemented in accordance with a method of the preferred embodiment and an exemplary L2 latch generally designated by the reference character 200 of an exemplary level sensitive scan design (LSSD) L1L2 latch implemented in accordance with a method of the preferred embodiment.

L1 latch 100 of FIG. 1 and L2 latch 200 of FIG. 2 together form a shift register latch or LSSD L1L2 latch pair implemented in accordance with a method of the preferred embodiment.

As shown in FIG. 1, L1 latch 100 has two input ports, scan in data I and data in D, a pair of mutually exclusive clocks A and C, and an output L1_TP. When the clock A is active, the scan in data I becomes the content of the latch. This path is only used for testing. When the clock C is active, the Data in D value is loaded into the latch. The output L1_TP of the L1 latch 100 for the illustrated implementation is the invert of the contents of the L1 latch at node L1_T.

As shown in FIG. 2, L2 latch 200 has a single input clock B, and when clock B is active, the output of the L1 latch 100 indicated at node L1_TP is transferred into the L2 latch 200. The common implementation of logic alternates the clocks C and B during normal operation and the output at node L2 of the L2 latch 200 is used to drive subsequent logic.

In FIGS. 1 and 2, the clocks B and C are the inverse of each other, usually fed from the same clock splitter (not shown). The data latched in L1 latch 100 during the first half of a clock cycle is subsequently latched in L2 latch 200 during the second half of the clock cycle. The nodes labeled L1_T and L2_T are the same polarity as the input data D, and the nodes labeled L1_TP and L2_N are the inverse of the input data D. During the use of the set and reset paths, the scan clock A used for the scan path must remain in a low state.

In accordance with features of the preferred embodiments, a method is provided for implementing a latch with set/reset functions having the capability to maintain its latched states regardless of glitches on any one of its internal nodes. For example, the glitches can be caused by noise internal to the chip or free charge produced by impacts from incident radiation. In accordance with the method of the preferred embodiments, the L1 latch 100 and the L2 latch 200 gates off the path opposite that of the latched state. So if a 1 is currently latched on a node, the path to ground is gated off. Conversely, if a 0 is latched, the path to voltage supply VDD is gated off. Using this implementation, there is no real limit in the size of the disturbance to the internal node because the path to the incorrect state remains gated off. The main idea is to use data latched in L2 latch 200 to protect the internal states of L1 latch 100, and vice versa. Data latched in L1 latch 100 is used to protect the internal states of L2 latch 200.

In accordance with features of the preferred embodiments, the method implements a latch with devices having minimum size, substantially smaller than required by conventional arrangements with capacitance added to the internal nodes. Aside from being able to fit into a smaller area, the internal capacitance of the new latch of the preferred embodiments is smaller, resulting in a decrease in switching power consumption as compared with conventional arrangements.

Referring now to FIG. 1, L1 latch 100 includes a first inverter defined by a P-channel and N-channel transistors PFET 102 and NFET 104 receiving a gate input I, a second inverter defined by a PFET 106 and NFET 108 receiving a gate input clock A. L1 latch 100 includes a first transistor stack defined by a pair of series connected PFETs 110, 112 and a pair of series connected NFETs 114, 116 connected between the voltage supply VDD and ground potential GND. L1 latch 100 includes a second transistor stack defined by a pair of series connected PFETs 118, 120 and a pair of series connected NFETs 122, 124. The common connection of PFET 106 and NFET 108 is coupled to a gate input of PFETs 112, and 122. A common gate connection is provided for PFETs 108, 114, and 120. L1 latch 100 includes a third transistor stack defined by a pair of series connected PFETs 126, 128 and a pair of series connected NFETs 130, 132. The common connection of PFET 128 and NFET 130 is coupled to a gate input of PFETs 118, and 124 and coupled to a gate input of PFETs 126, and 128. L1 latch 100 includes a pair of P-channel transistors 134, 136 and a pair of N-channel transistors 138, 140 forming the AND INVERT functions. The output L1_TP at the connection of PFET 136 and NFET 138 is connected to the common connection of PFET 128 and NFET 130. L1 latch 100 includes an inverter defined by PFET 142 and NFET 144 receiving a gate input clock C providing an inverted clock C_NOT. The inverted clock C_NOT is applied to the gate input of PFET 128 and NFET 130.

In accordance with features of the preferred embodiment, L1 latch 100 includes a pair of PFETs 150, 152 connected between the second transistor stack PFET 118 and the voltage supply VDD. An inverted clock C_NOT is applied to the gate of PFET 150. An internal state of L2 latch 200 at node L2_N is applied to the gate of PFET 152. L1 latch 100 includes a pair of NFETs 154, 156 connected between the second transistor stack NFET 124 and ground. The clock C is applied to the gate of NFET 154. The internal state of L2 latch 200 at node L2_N is applied to the gate of NFET 156. A PFET 158 is connected between the third transistor stack PFET 126 and the voltage supply VDD. An NFET 158 is connected between the third transistor stack NFET 132 and ground. The internal state of L2 latch 200 at node L2_N is applied to the gate of PFET 158 and NFET 160. A PFET 162 is connected in parallel with PFET 158 and an NFET 164 is connected in parallel with NFET 160. The inverted clock A_NOT is applied to the gate input of PFET 162 and NFET 164.

In operation of L1 latch 100 in accordance with the method of the preferred embodiments, transistors PFET 150 and NFET 154 have been added to the L1 latch design. PFET 150 and NFET 154 respectively is connected in parallel to the PFET 152 and NFET 156 gating devices. PFET 150 and NFET 154 are turned on when the C clock goes high. When data is being driven into L1 latch 100, the new L1 latch 100 allows for both L1_T and L1_TP to be set to a known state before data is propagated to L2 latch 200.

Referring now to FIG. 2, L2 latch 200 includes a first transistor stack defined by a pair of series connected PFETs 202, 204 and a pair of series connected NFETs 206, 208 connected between the voltage supply VDD and ground potential GND forming a first and second AND INVERT function. L2 latch 200 includes an inverter defined by a PFET 212 and NFET 214 receiving a gate input clock B. L2 latch 200 includes a second transistor stack defined by a plurality of series connected PFETs 216, 218, 220 and a plurality of series connected NFETs 222, 224, 226 connected between the voltage supply VDD and ground potential GND. L2 latch 200 includes a third transistor stack defined by a pair of series connected PFETs 230, 232 and a pair of series connected NFETs 234, 236 connected between the voltage supply VDD and ground potential GND. L2 latch 200 includes a pair of P-channel transistors 238, 240 and a pair of N-channel transistors 242, 244 forming AND INVERT functions, with the output L2 at the connection of PFET 240 and NFET 242.

In operation of L1 latch 100 and L2 latch 200 in accordance with the method of the preferred embodiments, when D is a 1 and the data has been propagated through to the L2 latch 200, L1_T is high, L1_TP is low, L2_T is high, and L2_N is low. The data latched in L2 latch 200 at L2_N and L2_T is used to protect the internal states of L1 latch 100, and the data latched in L1 latch 100 at L1_T and L1_TP is used to protect the internal states of L2 latch 200. In accordance with the method of the preferred embodiments, the latch gates off the path opposite that of the latched state, so for nodes L1_T and L2_T latched high or 1, the path to ground is gated off. For nodes L1_TP and L2_N latched low or 0, the path to voltage supply VDD is gated off.

Referring to FIG. 1 in the L1 latch 100, a positive glitch on L1_TP typically could flip the L1_T to a low state in conventional arrangements. However, through the series connected NFET stack of NFETs 122, 124, 156, there is no path from L1_TP to ground because L2_N is low and NFET 156 is turned off. Similarly, a negative glitch on L1_T typically could flip L1_TP high in conventional arrangements. However, through series connected PFET stack of PFETs 128, 126, 158 there is no path from L1_TP to the voltage rail VDD, because L2_T is high, PFET 158 is turned off Referring to FIG. 2 in the L2 latch 200, a negative glitch on L2_T typically could flip the L2_N to a high state in conventional arrangements. However, through the series connected PFET stack of PFETs 232, 230 there is no path from L2_N to the voltage rail VDD, because L1_T is high, PFET 230 is off and L2_N remains low. A positive glitch on L2_N typically could flip the L2_T to a low state in conventional arrangements and cause a negative glitch on the L2 output. However, through the series connected NFET stack of NFETs 224, 226 and the series connected NFET stack through the NFETs 242, 244, there is no path from either L2_N or L2 to ground because L1_TP is low, both NFET 226 and NFET 244 are turned off, so both paths to ground are disconnected.

In operation of L1 latch 100 and L2 latch 200 in accordance with the method of the preferred embodiments, when D is a 0 and the data is latched in both L1 latch 100 and L2 latch 200, L1_T is low, L1_TP is high, L2_T is low, and L2_N is high. In accordance with the method of the preferred embodiments, the latch gates off the path opposite that of the latched state, so for nodes L1_TP and L2_N latched high or 1, the path to ground is gated off. For nodes L1_T and L2_T latched low or 0, the path to voltage supply VDD is gated off.

Referring to FIG. 1 in the L1 latch 100, a negative glitch on L1_TP does not flip the L1_T to a high state. Through the series connected PFET stack of PFETs 152, 118, 120, since L2_N is high, PFET 152 is turned off, gating off the path between L1_T and VDD. A positive glitch on L1_T does not flip L1_TP to a low state through the series connected NFET stack through the NFETs 130, 132, 160 because L2_T is low, NFET 160 is off and there is no path from L1_TP to ground.

Referring to FIG. 2 in the L2 latch 200, a positive glitch on L2_T does not flip L2_N to a low state. Through the series connected NFET stack of NFETs 234, 236 because L1_T is low, NFET 236 is turned off and there is no path to ground. Also, a negative glitch on L2_N does not flip L2_T to a high state or cause a positive glitch on L2. Through the series connected PFET stack of PFETs 216, 218 and through the series connected PFET stack of PFETs 238, 240, since L1_TP is high, PFET 230 and PFET 238 are turned off so there is no path to the voltage supply VDD from either L2_T or the L2 output.

Figure 3:
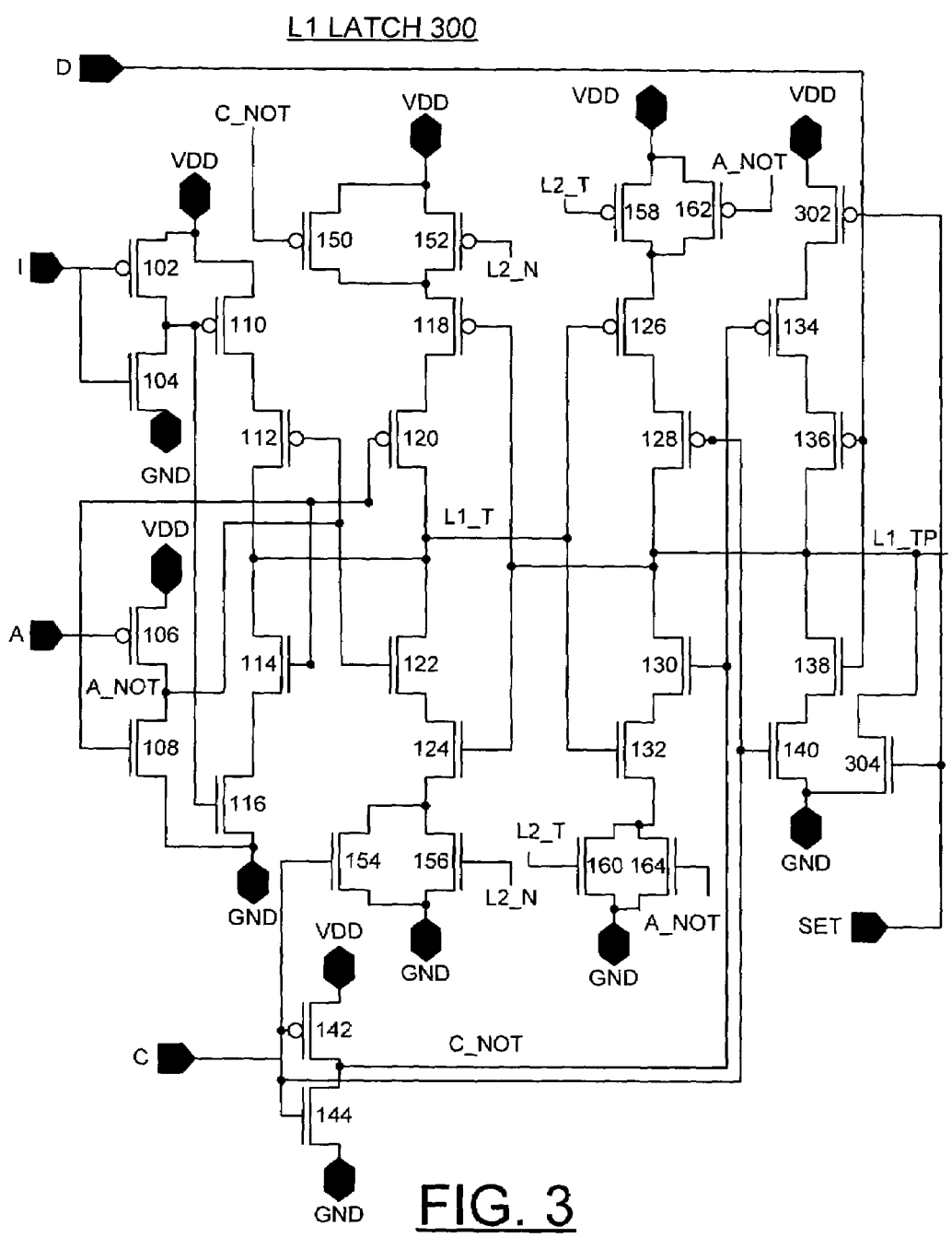
FIG. 3 is a schematic diagram of another exemplary L1 latch enabling a set function of an exemplary level sensitive scan design (LSSD) L1L2 latch implemented in accordance with a method of the preferred embodiment.

Referring to FIG. 3, there is shown another exemplary L1 latch enabling a set function generally designated by the reference character 300 of an exemplary level sensitive scan design (LSSD) L1L2 latch implemented in accordance with a method of the preferred embodiment. L1 latch 300 allows the L1L2 latch to be set to a high state with the L2 latch 200 remaining the same as shown in FIG. 2. In FIG. 3, the same reference characters used for L1 latch 100 are used similar or identical components of the L1 latch 300. L1 latch 300 includes an additional PFET 302 coupled between the voltage supply VDD and PFET 134 and an additional NFET 304 coupled between the node $L_1$_TP and ground. A set input SET is applied to the gate of both PFET 302 and NFET 304. NFET 304 pulls L1_TP low when the set input SET goes high. A high signal on the set input SET also turns off PFET 302 so there is no path to VDD through the series connected PFET stack of PFETs 302, 134, 136 in a case where clock C is high and D is low. Since the L1_TP state is the inverse of the normal data input, the L2 output of L2 latch 200 is pulled high as soon as clock C goes low and clock B goes high.

Figure 4:
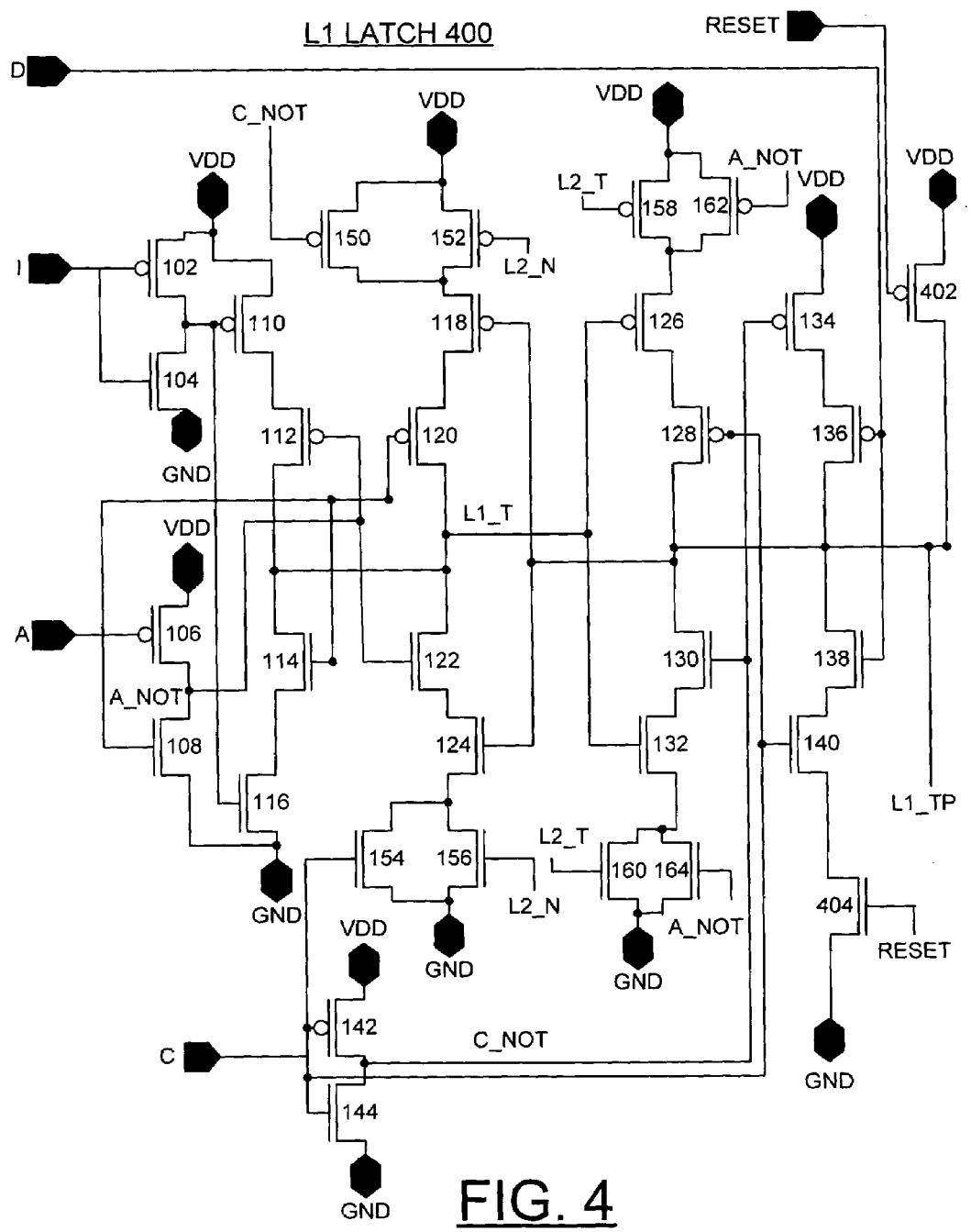
FIG. 4 is a schematic diagram of another exemplary L1 latch enabling a reset function of an exemplary level sensitive scan design (LSSD) L1L2 latch implemented in accordance with a method of the preferred embodiment.

Referring to FIG. 4, there is shown another exemplary L1 latch enabling a reset function generally designated by the reference character 400 of an exemplary level sensitive scan design (LSSD) L1L2 latch implemented in accordance with a method of the preferred embodiment. L1 latch 400 allows the L1L2 latch to be reset to a low state with the L2 latch 200 remaining the same as shown in FIG. 2. In FIG. 4, the same reference characters used for L1 latch 100 are used similar or identical components of the L1 latch 400. L1 latch 400 includes an additional PFET 402 coupled between the voltage supply VDD and the node L1_TP and an additional NFET 404 coupled between NFET 140 and ground. A reset input RESET is applied to the gate of both PFET 402 and NFET 404. The L1_TP node is pulled high by PFET 402 when the reset input RESET goes low. A low reset input RESET also turns off the NFET 404 in the series connected NFET stack of NFETs 138, 140, 404, overriding a high D data input during a high C clock cycle. The high L1_TP is propagated to a low L2 state as soon as the clock C goes low and the clock B goes high.

While the present invention has been described with reference to the details of the embodiments of the invention shown in the drawing, these details are not intended to limit the scope of the invention as claimed in the appended claims.

What is claimed is:

1. A method for implementing enhanced noise immunity performance in a latch circuit including an L1 latch and an L2 latch coupled to the L1 latch, said method comprising:

latching data in the L1 latch during a first half clock cycle and providing a latched data state at an L1 latch output node and then latching data in the L2 latch during a second half clock cycle and providing a latched data state at an L2 latch output node;

connecting a plurality of gated transistors between said L1 latch output node and ground, and between said L1 latch output node and a voltage supply for gating off a path from said L1 latch output node to ground with a high latched data state at said L1 latch output node;

connecting a plurality of gated transistors between said L2 latch output node and ground, and between said L2 latch output node and said voltage supply for gating off a path from said L2 latch output node to ground with a high latched data state at said L2 latch output node; and connecting predefined L2 nodes to selected gates of said plurality of gated transistors in the L1 latch.

2. A method for implementing enhanced noise immunity performance in a latch circuit as recited in claim 1 includes connecting predefined L1 nodes to selected gates of said plurality of gated transistors in the L2 latch.

\* \* \* \* \*